(12) United States Patent
Nakamura (10) Patent No.: US 6,978,008 B2
(45) Date of Patent: Dec. 20, 2005

(54) ZERO CROSSING DETECTION CIRCUIT (75) Inventor: Tokuo Nakamura, Kanagawa-Ken (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 463 days.

(21) Appl. No.: 10/271,779

(22) Filed: Oct. 17, 2002

(65) Prior Publication Data
US 2003/0161465 A1    Aug. 28, 2003

(30) Foreign Application Priority Data
Feb. 28, 2002 (JP) .............................. 2002/052544

(51) Int. Cl.[7] .............................................. H04M 3/22
(52) U.S. Cl. ..................................... 379/382; 379/165
(58) Field of Search ................................. 379/382, 377, 379/165; 123/614; 340/310.04; 375/342

(56) References Cited

U.S. PATENT DOCUMENTS 5,875,245 A * 2/1999 Miyasita et al. ............ 379/382

FOREIGN PATENT DOCUMENTS

| JP | 3-124154 | 5/1991 |
|---|---|---|
| JP | 6-350741 | 12/1994 |
| JP | 10-75323 | 3/1998 |

* cited by examiner

Primary Examiner—Sihn Tran
Assistant Examiner—Walter F. Briney, III
(74) Attorney, Agent, or Firm—Rabin & Berdo, P.C.

(57) ABSTRACT

A PNPN structure thyristor and a third P-type impurity region are formed on a semiconductor substrate, and a fixed current circuit using an NPN transistor 20 and a resistor 30 is connected to a cathode terminal K and a gate terminal G of a composite element 10 that has a P-channel MOS transistor Q3 with the third P-type impurity region as a drain connected to a PNP transistor Q1 of the thyristor. If a voltage applied to the anode terminal A of the composite element 10 rises from 0V, initially the thyristor is on and current flows, but once the threshold voltage of transistor Q3 is reached transistor Q3 turns on. A short circuit then exists between the base and emitter of transistor Q3 of the thyristor and current of the composite element 10 itself is cut off. Because of the bipolar structure it is simple to configure a small integrated circuit with a high withstand voltage. In this way, a zero crossing detection circuit is provided that has high withstand voltage characteristics, but which can be made as a small sized integrated circuit.

17 Claims, 5 Drawing Sheets

Fig. 1

PRIOR ART

Fig. 2 (a)

PRIOR ART

ZERO CROSSING DETECTION CIRCUIT

BACKGROUND OF INVENTION

The present invention relates to a zero crossing detection circuit for detecting reversal of polarity of a voltage applied to a telephone line or the like.

In the related art, the following publications disclose examples of technology in this field.
Publication 1: Japanese Patent Laid-open No. Hei. 3-124154
Publication 2: Japanese Patent Laid-open No. Hei. 10-75323

Figure 2:
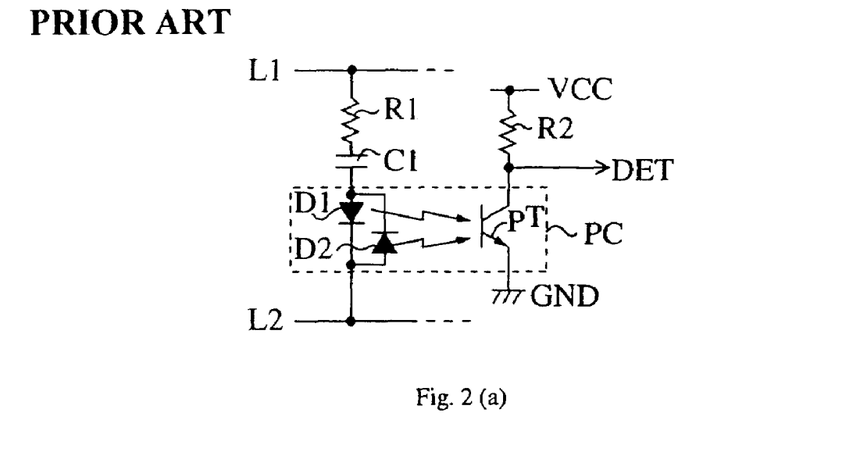
FIG. 2 is a circuit diagram showing an example structure of a related art polarity reversal detection circuit.

FIG. 2(a) and FIG. 2(b) are circuit diagrams showing an example structure of a polarity reversal detection circuit of the related art. These circuits are for non-ringing terminals such as telemeters and detect polarity reversal information such as seize signals or restore signals transmitted from a telephone through a telephone line.

FIG. 2(a) is the polarity reversal detection circuit of publication 1, having a resistor R1, capacitor C1 and photocoupler PC connected in series across telephone lines L1 and L2. The photocoupler PC is configured of two light emitting diodes connected in opposite polarity in parallel with each other at the input side, and a light signal couples between the input side and a phototransistor PT at the output side. One end of the output side of the photocoupler PC is connected through a resistor R2 to a source voltage VCC, and the other end is connected to ground potential GND. A detection signal DET is then output from the one end of the output side of the photocoupler PC.

With this polarity reversal detection circuit, when a voltage across the telephone lines L1 and L2 is fixed, the capacitor C1 is charged by this voltage and current does not flow in the input side of the photocoupler PC. Accordingly, the phototransistor PT of the photocoupler PC is in an OFF state and the detection signal DET becomes the source voltage VCC. Here, if there is a reversal in the polarity of the voltage applied across the telephone lines L1 and L2, current flows in the input side of the photocoupler PC until the capacitor C1 is charged to the reverse polarity voltage. Then, depending on the direction of current flow, one of the light emitting diodes D1 and D2 of the photocoupler PC emits light and the phototransistor PT is temporarily put into an ON state. In this way, a detection signal DET at substantially the ground potential GND is output in a pulse shape.

FIG. 2(b) is the polarity reversal detection circuit of publication 2, comprised of a full wave rectifier circuit REC connected across telephone lines L1 and L2, and edge detection circuits EDG1 and EDG2 connected across the telephone lines L1 and L2 and a negative electrode GND side of the full wave rectifier circuit REC.

The edge detection circuits EDG1 and EDG2 have the same structure, and, for example, edge detection circuit EDG1 comprises a current mirror M1 comprised of transistors T1 and T2, a current mirror M2 comprised of transistors T3 and T4, a switched current amplifier S1 comprised of transistors T5 and T6 and resistor R1, a constant current amplifier C1 comprised of transistors T7 and T8 and resistor R2, and Zener diodes Z1 and Z2.

Emitters of transistors T1 and T2 of the current mirror M1 are connected to the telephone line L1, and the bases of these transistors T1 and T2 are connected to the collector of transistor T2 and emitters of transistors T3 and T4 of the current mirror M2.

The cathode of Zener diode Z2 is connected to the collector of transistor T1, while the anode of the Zener diode Z2 is connected to the collector of transistor T5 of the current amplifier S1 and to the bases of transistors T5 and T6. The emitter of transistor T6 is connected to the negative electrode GND, while the emitter of transistor T5 is connected to the negative electrode GND of the full wave rectifier circuit through resistor R1.

The bases of transistors T3 and T4 of current mirror M2 are connected to the collector of transistor T4 and the collector of transistor T8 of the current amplifier C1.

The collector of transistor T3 is connected to the cathode of Zener diode Z1, while the anode of Zener diode Z1 is connected to the collector of transistor T6 of the current amplifier S1, the collector and base of transistor T7 of current amplifier C1, and the base of transistor T8.

The emitter of transistor T7 is connected to the negative electrode GND of the full wave rectifier circuit REC, while the emitter of transistor T8 is connected to the negative electrode GND through resistor R2. A detection signal DET1 is then output from the emitter of transistor T8.

Here, a breakdown voltage Voff of the Zener diode Z2 is set so as to be higher than a breakdown voltage Von of the Zener diode Z1, and lower than a voltage Vp applied to the telephone line L1. Also, a loop current amplification factor of a fixed current loop CL looping the current amplifier C1 from the current mirror M1 is set so as to become 1 when the Zener diode Z1 is in an on state.

In this polarity reversal detection circuit, polarity of a voltage applied to the telephone lines L1 and L2 reverses and the potential V1 of the telephone line L1 rises from zero.

When the potential V1 is lower than the breakdown voltage Von of the Zener diode Z1, both of the Zener diodes Z1 and Z2 are in an off state, and so current does not flow in the edge detection circuit EDG1.

If the potential V1 exceeds the breakdown voltage Von, the Zener diode Z1 turns on and a fixed current starts to flow in the fixed current loop CL.

If the potential V1 rises further and exceeds the breakdown voltage Voff, the Zener diode Z2 is turned on and current starts to flow in transistor T5 of current amplifier S1. As a result, a corresponding current also flows in transistor T6. Since current flowing in transistor T6 flows from transistor T3 of current mirror M2 through Zener diode Z1, the loop current amplification factor of the fixed current loop CL becomes smaller than 1. Therefore, current flowing in the fixed current loop CL becomes gradually smaller, and an off state finally results. After that, even if the potential V1 rises even further, current will not flow in the fixed current loop CL. As a result, when the potential V1 of the telephone line L1 rises up, a fixed current only flows in transistor T8 for a short time that elapses from voltage Von to Voff, and a detection signal DET1 having a pulse shape depending on the fixed current is output.

However, with the polarity reversal detection circuit of the related art, there are the following problems.

Specifically, the polarity reversal detection circuit of FIG. 2(a) is characterized by an extremely simple circuit structure, but a capacitor C1 having a large capacitance of, for example, 1 $\mu$F and a high withstand voltage of 250V or more is required, making it impossible to incorporate in an integrated circuit.

On the other hand, the polarity reversal detection circuit of FIG. 2(b) is normally held in an off state when the potential of the telephone lines L1 and L2 is constant. Therefore, transistors T1, T3 and T8 are required to have a high withstand voltage of, for example, at least 250V so as to withstand the voltage across the telephone lines L1 and L2. Also, this circuit has many other circuit structural elements besides the high withstand voltage transistors, which means that the size of an integrated circuit would be large.

SUMMARY OF THE INVENTION

The present invention has been conceived in view of the above-described problems of the related art, and provides a zero crossing detection circuit (polarity reversal detection circuit) having a high withstand voltage that can be formed as a small sized integrated circuit.

In order to solve the above-described problems, a first aspect of the present invention is a zero crossing circuit comprising an input terminal and an output terminal, a composite element, having a first node connected to the input terminal and a second node and a third node being connected across the first node and the second and third node, a fixed current circuit connected across the second node and the output terminal, and a limiting circuit connected across the third node and the output terminal for limiting current flowing in the fixed current circuit, the composite element having the following structure.

Specifically, this composite element is comprised of a first switch element connected across the first node and the second node, a second switch element connected across the first switch element and the third node, and a third switch element connected across the second switch element and the first node, the first switch element being in an ON state when the polarity of a signal input to the input terminal reverses and being short circuited to enter an OFF state as a result of the third switch element being in an ON state, the second switch element being in an on state when the polarity of a signal input to the input terminal reverses and entering an OFF state when the first switch element is in an OFF state, the third switch element being in an off state when the polarity of a signal input to the input terminal reverses and entering an ON state when the signal input to the input terminal reaches a specified potential. Also, the fixed current circuit operates when the second switch element is in an ON state.

A second aspect of the present invention has the composite element of the first aspect of the invention comprised of, for example, first, second and third P-type impurity regions formed inside an N-type single crystal silicon substrate, a first N-type impurity region formed inside the second P-type impurity region, a second N-type impurity region formed at the same time as the first N-type impurity region is formed, electrode wiring connecting the second N-type impurity region and the third P-type impurity region, an anode electrode taken from the first P-type impurity region, a gate electrode taken from the second P-type impurity region, electrode wiring constituting a cathode electrode connecting P-channel MOS transistors formed in the first and third P-type impurity regions with the first N-type impurity region, a fixed width field plate provided between the first and second P-type impurity regions, and a channel stopper provided around the second P-type impurity region.

According to the second aspect of the invention, the following operations can be carried out in the composite element.

A fixed width field plate can be provided between the first and second P-type impurity regions, and a channel stopper can be provided around the second P-type impurity region. In this way, after interruption of composite element current, convergence of an applied voltage into an electric field is decreased by the field plate and the electric field at the channel stopper can be further suppressed. Accordingly, by appropriately setting the dimensions of the field plate and the channel stopper, it is possible to realize an element having a desired high withstand voltage.

A third aspect of the invention is the second aspect of the invention having a fifth impurity region of a first conductivity type provided on a semiconductor substrate, adjacent to the first impurity region, with the first impurity region and the fifth impurity region being electrically connected to each other.

A fourth aspect of the invention is the second aspect of the invention in which, when the third switch element is in an ON state the first switch element enters an OFF state due to short circuiting across a first base and a first emitter.

A fifth aspect of the invention is the second aspect of the invention having a channel stopper provided between the second impurity region and the third impurity region.

A sixth aspect of the invention is the second aspect of the invention in which a voltage breakdown element for operating voltage control is connected in series with this zero crossing detection circuit.

A seventh aspect of the invention is the second aspect of the invention in which a current control circuit, for controlling input current input to the input terminal or output current output to the output terminal, is connected in series between the input terminal and the output terminal.

An eighth aspect of the invention is the seventh aspect of the invention in which the current control circuit is formed by a current mirror.

BRIEF DESCRIPTION OF DRAWINGS

While the specification concludes with claims particularly pointing out and distinctly claiming the subject matter which is regarded as the invention, it is believed that the invention, the objects, features and advantages thereof will be better understood from the following description taken in connection with the accompanying drawings in which:

DETAILED DESCRIPTION OF THE PREFERRED EMBODIMENT

Figure 1:
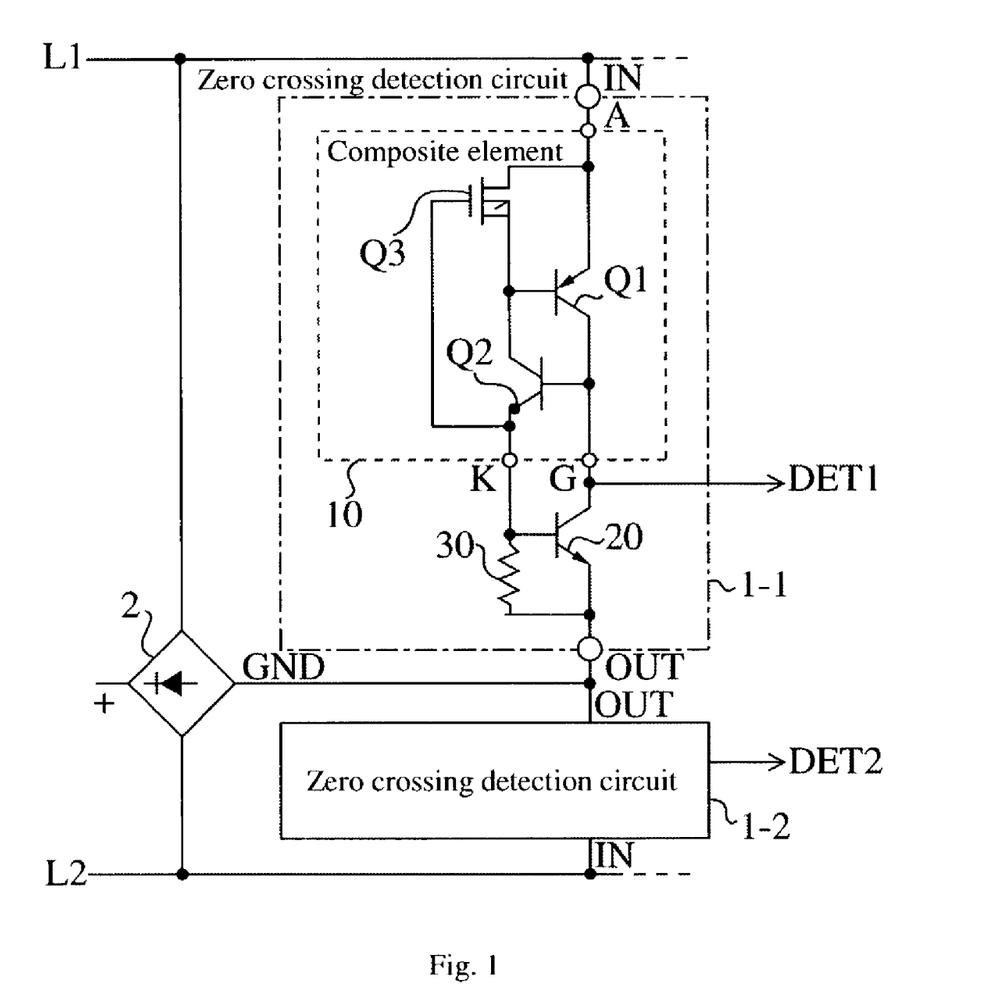
FIG. 1 is a circuit diagram of a polarity reversal detection circuit of a first embodiment of the present invention.

FIG. 1 is a circuit diagram of a polarity reversal detection circuit of a first embodiment of the present invention.

This polarity reversal detection circuit is for, in a non-ringing terminal such as a telemeter, detecting polarity reversal information, being a seize signal or a restore signal, transmitted from a telephone, and comprises a full wave rectifier circuit 2 connected across telephone lines L1 and L2, and zero crossing detection circuits 1-1 and 1-2 respectively connected across the telephone lines L1 and L2 and a negative electrode GND side of the full wave rectifier circuit 2.

The zero crossing detection circuits 1-1 and 1-2 have the same structure, and the zero crossing circuit 1-1, for example, is comprised of a 3-terminal composite element 10 having a combination of thyristors and MOS transistors, an NPN fixed current transistor 20 and a resistor 30, and has an input terminal IN connected to a telephone line side, and an output terminal OUT connected to a ground potential side.

The composite element 10 has a P-channel MOS transistor Q3 combined with a thyristor composed of a PNP transistor Q1 and an NPN transistor Q2. Specifically, the emitter of transistor Q1 is connected to an anode terminal A, and the collector of this transistor Q1 is connected to a gate terminal G. The base of transistor Q1 is connected to the collector of transistor Q2, and the emitter of this transistor Q2 is connected to a cathode terminal K.

On the other hand, the source of transistor Q3 is connected to both the emitter of transistor Q1 and the anode terminal A, while a substrate potential and drain of this transistor Q3 are connected to the base of transistor Q1 and the collector of transistor Q2. Also, the gate of transistor Q3 is connected to the emitter of transistor Q2 and to the cathode terminal K.

The anode terminal A of the composite element 10 is connected to the telephone line L1 through the input terminal IN, and the gate terminal G is connected to the collector of transistor 20. Also, the cathode terminal K of the composite element 10 is connected to the base of the transistor 20 and one end of the resistor 30. The other end of the resistor 30 and the emitter of the transistor 20 are connected through the output terminal OUT to a negative electrode GND of the full wave rectifier circuit 2. A detection signal DET1 is then output from the collector side of the transistor 20.

Similarly, the zero crossing detection circuit 1-2 is connected across the telephone line L2 and the negative electrode GND side of the full wave rectifier circuit 2 and outputs a detection signal DET2.

FIG. 3(a) and FIG. 3(b) are schematic diagrams showing the structure of the composite element 10 in the drawing, FIG. 3(a) being a plan view and FIG. 3(b) being a cross sectional view along line X—X in FIG. 3(a).

The composite element 10, as shown in FIG. 3(a) and FIG. 3(b), has P-type impurity regions 12, 13 and 14 having a concentration of P-type impurities such as boron of 1e18 cm$^{-3}$ formed using a well known ion implantation technique, for example, formed inside an N-type single crystal silicon substrate 11 (for example, specific resistance ρs=15 to 22 Ω·cm). N-type impurity regions 15 and 16 having a concentration of N-type impurities such as phosphorous of 1e20 cm$^{-3}$ are also formed inside the p-type impurity region 13 and inside the single crystal silicon substrate 11 using a similar process. Also, an insulation film 17 of, for example, about 1 μm is formed on the surface of the single crystal silicon substrate 11 except for electrode connection portions of the P-type impurity regions 12, 13 and 14 and the N-type impurity regions 15 and 16.

The P-type impurity region 12 corresponds to the emitter of the transistor Q1 and the source of the transistor Q3 in the composite element 10 shown in FIG. 1, and is connected to the anode terminal A using, for example, electrode wiring 18 of aluminum or the like. The width of the P-type impurity region 12 is formed to 24 μm, for example.

The P-type impurity region 13 corresponds to the collector of the transistor Q1 and the base of the transistor Q2 in the composite element 10, and is connected to the gate terminal G using electrode wiring 19. The width of the P-type impurity region 13 is, for example, 48 μm.

The P-type impurity region 14 corresponds to the drain of the transistor Q3 in the composite element 10, and the width of this P-type impurity region 14 is, for example, 20 μm.

The N-type impurity region 16 corresponds to the base of the transistor Q1, the collector of the transistor Q2 and the substrate potential of transistor Q3 in the composite element 10, and is connected to the P-type impurity region 14 using electrode wiring 21. The width of the N-type impurity region 16 is, for example, 16 μm.

The N-type impurity region 15 corresponds to the emitter of the transistor Q2 in the composite element 10, and is connected to the cathode terminal K by electrode wiring 20. The width of the N-type impurity region 15 is, for example, 16 μm.

The P-type impurity regions 12 and 13 are formed separated by a distance of 50 μm, for example, and an N-type region 11A between these two P-type impurity regions corresponds to the base of transistor Q1 in the composite element 10. A field plate using the wiring 20 is formed on the region 11A via an insulating film 16 formed thickly at a peripheral section.

The P-type impurity regions 12 and 14 are formed separated by a distance of 14 μm, for example, and an N-type region 11B between these two P-type impurity regions corresponds to the gate of transistor Q3 in the composite element 10. A gate electrode using the wiring 22 is formed on the region 11B via the insulating film 17, and is connected to the cathode terminal K.

The P-type impurity region 13 is formed at an inner side of the single crystal silicon substrate 11 so as to be separated from the peripheral section of the single crystal silicon substrate 11 by a distance of 50 μm. Also, the thickness of the electrode wiring 20 formed on the insulation film 17 is set to 30 μm so as to surround the periphery of the surface of the P-type impurity region 13. Further, a region of the single crystal silicon substrate 11 is secured at 20 μm at an outer side of the electrode wiring 20 as a channel stopper using, for example, polysilicon.

Figure 3:
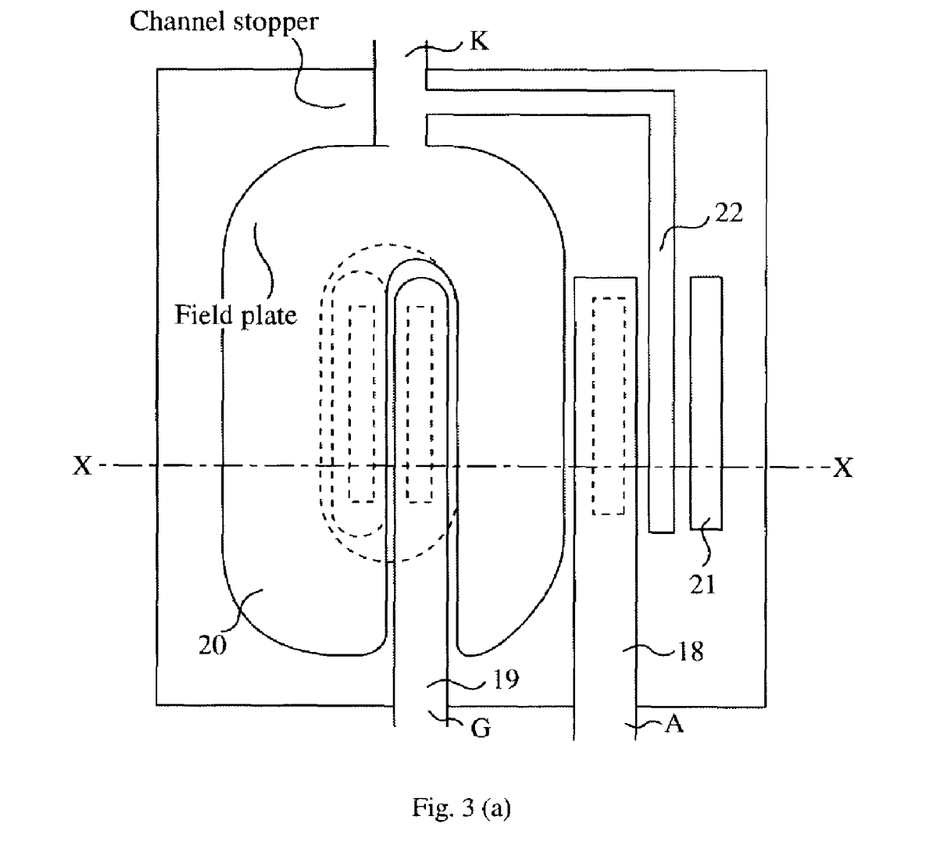
FIG. 3 is a schematic drawing showing the structure of a composite element 10 in FIG. 1.
Figure 4:
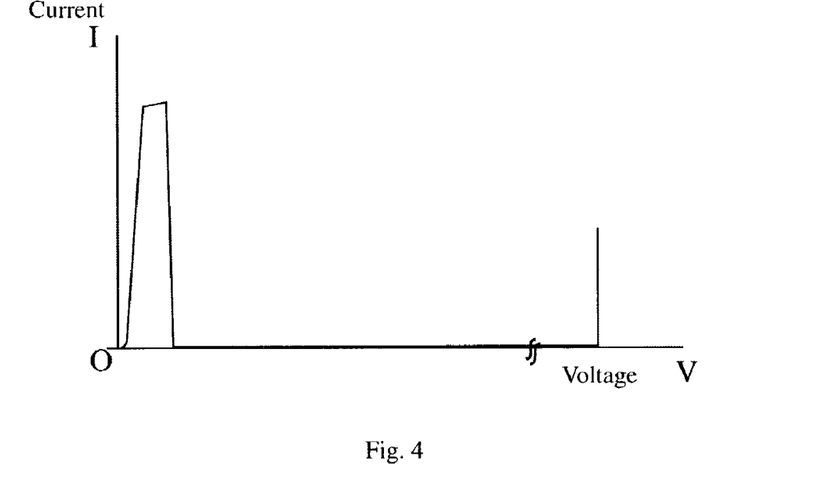
FIG. 4 is a characteristic diagram showing a relationship between voltage and current for the zero crossing detection circuit 1 in FIG. 1.

FIG. 4 is a characteristic diagram showing a relationship between voltage and current of the zero crossing detection circuit 1 in FIG. 1, having voltage V applied between the input terminal IN and the output terminal OUT shown on the abscissa, and current I flowing from the input terminal IN to the output terminal OUT shown on the ordinate. The operation of FIG. 1 will now be described in the following with reference to FIG. 3 and FIG. 4.

The polarity of the telephone lines L1 and L2 in FIG. 1 reverses to make the potential of the telephone line L1 higher than the potential of telephone line L2. The potential at the telephone line L1 side rises, and if the potential of the input terminal IN of the zero crossing detection circuit 1-1 exceeds the potential of the output terminal OUT and becomes equal to or higher than the forward bias voltage of a diode, the transistors q1 and q1 inside the composite element 10 are turned ON. As a result, current flows from the input terminal IN, through the transistors Q1 and Q2 to the output terminal OUT via resistor 30.

In this way, the potential of the cathode terminal K rises, the transistor 20 is turned on and the potential of the gate terminal G decreases. As a result, base current of the transistor Q2 is limited and the size of a current flowing from the input terminal IN of the zero crossing detection circuit 1-1 to the output terminal OUT becomes a fixed current state corresponding to the value of resistor 30 (for example a few tens of μA).

Also, if the telephone line L1 side potential rises, it exceeds the threshold voltage of the transistor Q3 in FIG. 1 and this transistor Q3 is turned on. Here, since the N-type impurity region 16 and the P-type impurity region 14 are connected by the electrode wiring 21, a short circuit exists between the base and emitter of the transistor Q1. In this way, the current flowing in the transistor Q1 and transistor Q2 is cut off. Even, if the telephone line L1 side potential rises further, the short circuit condition between the base and emitter of transistor Q1 does not vary, and current will not flow to transistor Q1 and transistor Q2 until the element withstand voltage (BVO) is reached. Accordingly, a detection signal DET1 output from the gate terminal G is output as a pulse signal at the instant the polarity of the telephone lines L1 and L1 reverses.

As described above, the polarity reversal detection circuit of the first embodiment has the following advantages.
(1) Since there are the P-type impurity regions 12 and 14 constituting a P channel transistor operated by input voltage applied to the input terminal IN, current of the composite element 10 itself is cut off by the input voltage exceeding the threshold voltage of the P-channel MOS transistor. In this way, it is not necessary to have an element constituting an off limit circuit for cutting off current when the input voltage rises, and it is possible to simplify the circuit structure.
(2) Because the size of current momentarily flowing when the polarity of the telephone line L1 and L2 reverses is limited by the value of the resistor 30, design is simple.
(3) Since the capacitor C1 as shown in FIG. 2(a) is not used, it is possible to simply configure a system having a plurality of non-ringing terminals connected in parallel on the same telephone lines L1 and L2.
(4) Since current flows momentarily at the time of polarity reversal of the telephone lines L1 and L2 and at other times there is normally an off state, it is possible to eliminate standby current.
(5) The composite element 10 has a field plate and a channel stopper, which means that a high withstand voltage is possible and it is also possible to handle high voltages such as lightning surges.
(6) By controlling film voltage of an insulating film provided on the P-type impurity regions 12 and 14 of the composite element 10, it is possible to freely set a current cut off voltage.
(7) Since the only element requiring a high withstand voltage of, for example, 250V, is the composite element 10, and there are only a few other circuit elements, it is possible to make the surface area of an integrated circuit small. The surface area of the composite element 10 shown in the example of FIG. 3(a) is 180×230 $\mu$m (=0.04 mm$^2$). Also, the surface areas of the transistor 20 and the resistor 30 are each 90×100 $\mu$m (=0.009 mm$^2$). Accordingly, the surface area of the zero crossing detection circuit 1 is about 0.06 mm$^2$.

On the other hand, in FIG. 2(b), if the surface areas of the transistor T1, transistor T3 and transistor T8 that requires a high withstand voltage of 250V are each 140×210 $\mu$m (=0.03 mm$^2$), and the surface areas of the other transistors etc. are each 90×100 $\mu$m (=0.009 mm$^2$), the surface area of the edge detection circuit EDG becomes approximately 0.17 mm$^2$. Accordingly, it is possible to make the surface area of the integrated circuit ⅓ compared to the related art circuit in FIG. 2(b).

Figure 5:
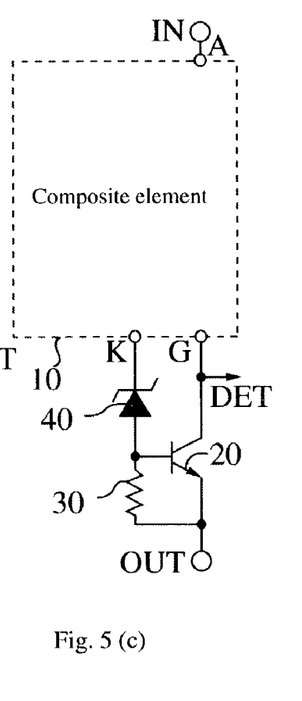
FIG. 5 is a schematic diagram of a zero crossing circuit of a second embodiment of the present invention.

FIG. 5(a) to FIG. 5(c) are schematic diagrams of a zero crossing detection circuit of a second embodiment of the present invention. Elements that are the same as those in FIG. 1 will be assigned the same reference numerals.

The zero crossing detection circuit of FIG. 5(a) has a voltage breakdown element (for example a Zener diode) 40 inserted between the input terminal IN and the anode terminal A of the composite element 10. The zero crossing detection circuit of FIG. 5(b) has a Zener diode 40 inserted between the emitter of the transistor 20 and the output terminal OUT. The zero crossing detection circuit of FIG. 5(c) has a Zener diode 40 inserted between the cathode terminal K of the composite element 10 and the base of the transistor 20. The remaining structure is the same as the zero crossing circuit in FIG. 1.

With this type of structure, when the potential of the input terminal IN rises with respect to the potential of the output terminal OUT, current will not flow until the breakdown voltage of the Zener diode 40 is reached. When the potential of the input terminal IN then reaches the breakdown voltage of the Zener diode 40, current momentarily flows from the input terminal IN to the output terminal OUT.

As described above, the zero crossing detection circuit of this second embodiment has a Zener diode 40, being a breakdown voltage element, inserted in series, which means that there is the advantage that an acting voltage for zero crossing detection can be set at any value.

Figure 6:
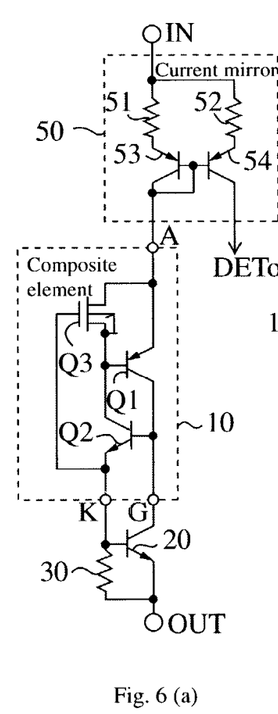
FIG. 6 is a schematic diagram of a zero crossing circuit of a third embodiment of the present invention.

FIG. 6(a) to FIG. 6(c) are schematic diagrams of a zero crossing detection circuit of a third embodiment of the present invention, and elements that are the same as those in FIG. 1 will be assigned the same reference numerals. The zero crossing detection circuit of FIG. 6(a) has an output circuit (for example, a current mirror) 50 inserted between the input terminal IN and the anode terminal A of the composite element 10. The current mirror 50 comprises resistors 51 and 52, and PNP transistors 53 and 54, with one end of each resistor 51 and 52 being connected to the input terminal IN. The other end of resistor 51 is connected to the emitter of transistor 53, while the collector and base of the transistor 53 are connected to the anode terminal A of the composite element 10. The other end of the resistor 52 is connected to the emitter of transistor 54, and the base of transistor 54 is connected to the anode terminal A of the composite element 10. A detection current DETo is then taken out from the collector of the transistor 54.

With this zero crossing detection circuit, current corresponding to current flowing in the composite element 10 is output from the current mirror 50 as detection current DETo.

The zero crossing detection circuit of FIG. 6(b) has a current mirror 50A inserted between the emitter of the transistor 20 and the output terminal OUT. The current mirror 50A is comprised of NPN transistors 55 and 56 and resistors 57 and 58, with the collector and base of the transistor 55 being connected to the base of transistor 56 and also to the emitter of transistor 20. The emitters of transistors 55 and 56 are connected to the output terminal OUT through respective resistors 57 and 58. A detection current DETi is then taken in through the collector of transistor 56.

With this zero crossing detection circuit, current corresponding to current flowing in the composite element 10 is input into the current mirror 50A as detection current DETi.

The zero crossing detection circuit of FIG. 6(c) has a current mirror 50B inserted between the cathode terminal K and the gate terminal G of the composite element 10 and the output terminal OUT. The current mirror 50B is comprised of NPN transistors 56, 59 and 60, resistors 58 and 61 and a diode 62.

The collector and gate of the transistor 60 are connected to the bases of transistors 56 and 59, and also to the cathode terminal K of the composite element 10. The emitter of transistor 60 is connected through the diode 62 to the output terminal OUT. The collector of the transistor 56 is connected to the gate terminal G of the composite element 10, while the emitter is connected through the resistor 61 to the output terminal OUT. Also, the emitter of the transistor 56 is connected via the resistor 58 to the output terminal OUT, and a detection current DETi is taken in through the collector of this transistor 56.

With this zero crossing detection circuit, current corresponding to current flowing in the composite element 10 is input into the current mirror 50B as detection current DETi.

As described above, the zero crossing detection circuit of this third embodiment has the current mirrors 50, 50A or 50B inserted in series, which means that it is possible to output a detection signal depending on current output or input. Also, by determining a mirror ratio to match the circuit of a subsequent stage, there is the advantage that it is possible to freely set the size of the detection current.

Figure 7:
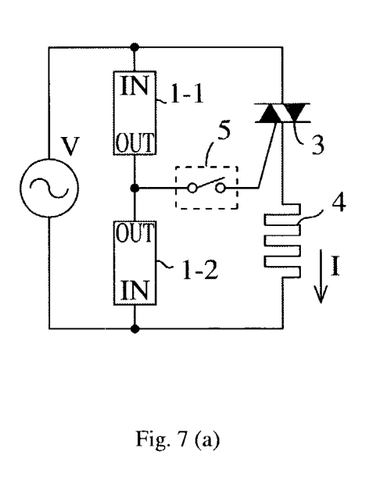
FIG. 7 is an explanatory drawing of a temperature control circuit of a fourth embodiment of the present invention.

FIG. 7(a) and FIG. 7(b) are explanatory drawings of a temperature control circuit of a fourth embodiment, FIG. 7(a) being a schematic diagram and FIG. 7(b) being an operating waveform diagram. This temperature control circuit adopts the zero crossing detection circuits 1-1 and 1-2 in FIG. 1. As shown in FIG. 7(a), one end of an a.c. power source AC is connected to the input terminal IN of the zero crossing detection circuit 1-1, while the output terminal OUT of this zero crossing detection circuit 101 is connected to node N. Further, the input terminal IN of the zero crossing detection circuit 1-2 is connected to the other end of the a.c. power source AC with the output terminal OUT of this zero crossing detection circuit 1-2 being connected to node N. An electrical heater 3 is also connected to the a.c. power source AC through a bi-directional thyristor 4, and a gate of the bi-directional thyristor 4 is connected through a heat control switch, such as a bimetallic strip, to node N.

With this temperature control circuit, when the a.c. power source AC crosses 0V, the zero crossing detection circuits 1-1 and 1-2 momentarily enter an ON state. At this time, if the temperature control switch 5 is on, trigger current flows in the gate of the bi-directional thyristor 4, the bi-directional thyristor 4 turns on and current I flows in the electrical heater 3. The current I continues to flow until the a.c. power source becomes 0V, regardless of whether the temperature control switch 5 is on or off after that.

When the a.c. power source next crosses 0V, if the temperature control switch 5 is off, trigger current does not flow in the gate of the bi-directional thyristor 4, this bi-directional thyristor 4 is off, and current I does not flow in the electrical heater 3.

As described above, the zero crossing detection circuit of this fourth embodiment uses the bi-directional thyristor 4 as a switch for turning the electrical heater 3 on and off, and the zero crossing detection circuits 1-1 and 1-2 are used in control of the bi-directional thyristor 4. In this way, turning the current flowing in the electrical heater 3 on or off is normally carried out at a point in time where the voltage of the a.c. power source AC is 0V and current is 0. As a result, with a simple circuit of the electrical heater 3 and the temperature control switch 5 connected in series, current is not forced on and off and it is possible to prevent the occurrence of noise due to an on/off operation.

The present invention is not limited to the above-described embodiments, and various modifications are possible. Examples of such modifications are given below.

(a) The layout and dimensions etc. of the composite element 10 of FIG. 3 are one example, and it is possible to vary them in line with usage conditions or desired characteristics etc.

(b) The zero crossing detection circuit of the present invention is not limited to a telephone line polarity reversal detection circuit or a electrical heater temperature control circuit, and can also be applied to a circuit for detecting timing at which an applied voltage passes close to 0V.

As has been described in detail above, according to the first aspect of the invention, a composite element that has a combination of, for example, PNPN structure thyristors and P-channel MOS transistors has been used, but it is also possible to obtain high withstand voltage characteristics with a small sized integrated circuit.

According to the second to fifth aspects of the present invention, the composite element of the first aspect of the invention has a fixed width field plate provided between first and second p-type impurity regions, and a channel stopper provided around the second P-type impurity region. In this way, by appropriately setting the dimensions of the field plate and channel stopper it is possible to obtain desired high withstand characteristics at a small size.

According to the sixth aspect of the present invention, a voltage breakdown element is connected in series with the zero crossing detection circuit of the second aspect of the invention. In this way, it is possible to freely set operating voltage.

According to the seventh and eighth aspects of the present invention, a current control circuit for controlling input/output current is provided in the zero crossing detection circuit of the second aspect of the invention. In this way, it is possible to freely set the size of input/output current to match a preceding or subsequent circuit.

What is claimed is:

1. A zero crossing detection circuit, comprising:
    an input terminal; an output terminal;
    a first node, a second node and a third node, being connected to the input terminal;
    a composite element, connected across the first node and the second and third nodes, the composite element comprising
        a first switch element connected across the first node and the second node,
        a second switch element connected across the first switch element and the third node, and
        a third switch element connected across the second switch element and the first node,
        the first switch element entering an on state when a polarity of a signal input to the input terminal reverses, and entering a short circuit state when the third switch element enters an on state,
        the second switch element entering an off state when polarity of the signal input to the input terminal reverses and entering an on state when the signal input to the input terminal reaches a specified potential;
    a fixed current circuit connected across the second node and the output terminal, and operating when the second switch element is in the on state; and
    a limit circuit limiting current flowing in the fixed current circuit and connected across the third node and the output terminal.

2. The zero crossing detection circuit of claim 1, wherein:
    the composite element is formed on a semiconductor substrate of a second conductivity type comprising first, second and third impurity regions of a first conductivity type provided apart from one another, and a fourth impurity region of the second conductivity type provided inside the third impurity region;

the first switch element is a first bipolar transistor of the second conductivity type having the second impurity region as a first emitter, the third impurity region as a first collector and a region between the second impurity region and the third impurity region as a first base;

the second switch element is a second bipolar transistor of the first conductivity type having the first base as a second collector, the third impurity region as a second base and the fourth impurity region as a second emitter; and the third switch element is a MOS transistor of the first conductivity type having the first impurity region as a drain region, the second impurity region as a source region and a region between the first impurity region and the second impurity region as a channel region.

3. The zero crossing detection circuit of claim 2, further comprising a fifth impurity region of the first conductivity type provided on the semiconductor substrate adjacent to the first impurity region, the first impurity region and the fifth impurity region being electrically connected to each other.

4. The zero crossing detection circuit of claim 2, wherein, when the third switch element is in the on state, there is a short circuit between the first base and the first emitter, and the first switch element is turned to an off state.

5. The zero crossing detection circuit of claim 2, further comprising a channel stopper provided between the second impurity region and the third impurity region.

6. A zero crossing detection circuit, comprising:
an input terminal; an output terminal;
a first node, a second node and a third node, being connected to the input terminal;
a composite element, connected across the first node and the second and third nodes, the composite element comprising
  a first switch element connected across the first node and the second node,
  a second switch element connected across the first switch element and the third node, and
  a third switch element connected across the second switch element and the first node,
  the first switch element entering an on state when a polarity of a signal input to the input terminal reverses, and entering a short circuit state when the third switch element enters an on state,
  the second switch element entering an off state when polarity of the signal input to the input terminal reverses and entering an on state when the signal input to the input terminal reaches a specified potential;
a fixed current circuit connected across the second node and the output terminal, and operating when the second switch element is in the on state;
a limit circuit limiting current flowing in the fixed current and connected across the third node and the output terminal; and
a voltage breakdown element controlling operating voltage and connected in series with the composite element between the input terminal and the output terminal.

7. The zero crossing detection circuit of claim 6, wherein the voltage breakdown element is a Zener diode.

8. The zero crossing detection circuit of claim 6, wherein:
the composite element is formed on a semiconductor substrate of a second conductivity type comprising first, second and third impurity regions of a first conductivity type provided apart from one another, and a fourth impurity region of the second conductivity type provided inside the third impurity region;

the first switch element is a first bipolar transistor of the second conductivity type having the second impurity region as a first emitter, the third impurity region as a first collector and a region between the second impurity region and the third impurity region as a first base;

the second switch element is a second bipolar transistor of the first conductivity type having the first base as a second collector, the third impurity region as a second base and the fourth impurity region as a second emitter; and the third switch element is a MOS transistor of the first conductivity type having the first impurity region as a drain region, the second impurity region as a source region and between the first impurity region and the second impurity region as a channel region.

9. The zero crossing detection circuit of claim 8, further comprising a fifth impurity region of the first conductivity type provided on the semiconductor substrate adjacent to the first impurity region, the first impurity region and the fifth impurity region being electrically connected to each other.

10. The zero crossing detection circuit of claim 8, wherein, when the third switch element is in the on state, there is a short circuit between the first base and the first emitter, and the first switch element is turned to an off state.

11. The zero crossing detection circuit of claim 8, further comprising a channel stopper provided between the second impurity region and the third impurity region.

12. A zero crossing detection circuit, comprising:
an input terminal; an output terminal; a first node, a second node and a third node, being connected to the input terminal;
a composite element, connected across the first node and the second and third nodes, the composite element comprising
  a first switch element connected across the first node and the second node,
  a second switch element connected across the first switch element and the third node, and
  a third switch element connected across the second switch element and the first node,
  the first switch element entering an on state when a polarity of a signal input to the input terminal reverses, and entering a short circuit state when the third switch element enters an on state,
  the second switch element entering an off state when polarity of the signal input to the input terminal reverses and entering an on state when the signal input to the input terminal reaches a specified potential;
a fixed current circuit connected across the second node and the output terminal, and operating when the second switch element is in the on state;
a limit circuit limiting current flowing in the fixed current circuit and connected across the third node and the output terminal; and
a current control circuit controlling input current input to the input terminal or output current output to the output terminal and connected in series with the composite element between the input terminal and the output terminal.

13. The zero crossing detection circuit of claim 12, wherein the current control circuit is a current mirror.

14. The zero crossing detection circuit of claim 12, wherein:

the composite element is formed on a semiconductor substrate of a second conductivity type comprising first, second and third impurity regions of a first conductivity type provided apart from one another, and a fourth impurity region of the second conductivity type provided inside the third impurity region;

the first switch element is a first bipolar transistor of the second conductivity type having the second impurity region as a first emitter, the third impurity region as a first collector and a region between the second impurity region and the third impurity region as a first base;

the second switch element is a second bipolar transistor of the first conductivity type having the first base as a second collector, the third impurity region as a second base and the fourth impurity region as a second emitter; and the third switch element is a MOS transistor of the first conductivity type having the first impurity region as a drain, the second impurity region as a source and a region between the first impurity region and the second impurity region as a channel region.

15. The zero crossing detection circuit of claim 14, further comprising a fifth impurity region of the first conductivity type provided on the semiconductor substrate adjacent to the first impurity region, the first impurity region and the fifth impurity region being electrically connected to each other.

16. The zero crossing detection circuit of claim 14, wherein, when the third switch element is in the on state, there is a short circuit between the first base and the first emitter, and the first switch element is turned to an off state.

17. The zero crossing detection circuit of claim 14, further comprising a channel stopper provided between the second impurity region and the third impurity region.

* * * * *